US012463137B2

(12) United States Patent
Zota et al.

(10) Patent No.: US 12,463,137 B2
(45) Date of Patent: Nov. 4, 2025

(54) INTEGRATED CIRCUIT DEVICE WITH INTERCONNECTS MADE OF LAYERED TOPOLOGICAL MATERIALS

(71) Applicant: INTERNATIONAL BUSINESS MACHINES CORPORATION, Armonk, NY (US)

(72) Inventors: Bogdan Cezar Zota, Rueschlikon (CH); Bernd W. Gotsmann, Horgen (CH); Heinz Schmid, Horgen (CH); Alan Molinari, Kilchberg (CH); Lorenzo Rocchino, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 439 days.

(21) Appl. No.: 18/060,979

(22) Filed: Dec. 2, 2022

(65) Prior Publication Data

US 2024/0186249 A1 Jun. 6, 2024

(51) Int. Cl.

| | |
|---|---|
| ***H01L 23/532*** | (2006.01) |
| ***H01L 23/522*** | (2006.01) |
| ***H01L 23/528*** | (2006.01) |
| ***H10D 84/01*** | (2025.01) |
| ***H10D 84/03*** | (2025.01) |
| *H10D 84/85* | (2025.01) |

(52) U.S. Cl.

CPC .... *H01L 23/53266* (2013.01); *H01L 23/5226* (2013.01); *H01L 23/5283* (2013.01); *H10D 84/0186* (2025.01); *H10D 84/038* (2025.01); *H10D 84/85* (2025.01)

(58) Field of Classification Search

CPC ........... H01L 23/53266; H01L 23/5226; H01L 23/5283; H10D 84/0186; H10D 84/038; H10D 84/85

USPC ........................................................ 257/686

See application file for complete search history.

(56) References Cited

U.S. PATENT DOCUMENTS 4,770,897 A 9/1988 Wu
5,453,642 A 9/1995 Kaja
5,761,802 A 6/1998 Grigas
(Continued)

FOREIGN PATENT DOCUMENTS

WO 2024/115987 A1 6/2024

OTHER PUBLICATIONS

Notification of Transmittal of the International Search Report and the Written Opinion of the International Searching Authority, or the Declaration, International Application No. PCT/IB2023/061152, Jan. 11, 2024, 10 pages.

Chen et al., "Topological Semimetals for Scaled Back-End-Of-Line Interconnect Beyond Cu" IBM Thomas J. Watson Research Center, Yorktown Heights, NY, 4 PGS, Accessed Aug. 9, 2022.

(Continued)

*Primary Examiner* — Tu-Tu V Ho
(74) *Attorney, Agent, or Firm* — Eric W. Chesley

(57) ABSTRACT

Described is an integrated circuit device comprising one or more interconnects. Each interconnect of the one or more interconnects can be structured as a stack of layers including distinct topological layers, where each of the distinct topological layers can be a layer of topological material. Any two successive layers of the distinct topological layers can be separated by one or more interfaces, each forming a boundary between two consecutive layers of the stack, where the two consecutive layers can be engineered to preserve topologically protected surface states of each of the any two successive layers of the distinct topological layers.

18 Claims, 8 Drawing Sheets

(56) References Cited

U.S. PATENT DOCUMENTS

| | | | | |
|---|---|---|---|---|
| 6,353,261 | B1 | 3/2002 | Weling | |
| 8,368,053 | B2 | 2/2013 | Liu | |
| 8,664,113 | B2 | 3/2014 | Kim | |
| 8,841,773 | B2 | 9/2014 | Chang | |
| 9,048,291 | B2 | 6/2015 | Inoue | |
| 2005/0037604 | A1 | 2/2005 | Babich | |
| 2014/0160835 | A1* | 6/2014 | Soree | G11C 11/161 365/158 |
| 2020/0044137 | A1 | 2/2020 | Schueffelgen et al. | |
| 2020/0235055 | A1 | 7/2020 | Hegde et al. | |
| 2021/0020744 | A1 | 1/2021 | Duan | |
| 2022/0157733 | A1 | 5/2022 | Chen et al. | |
| 2022/0375754 | A1* | 11/2022 | Taylor | H01L 21/02321 |
| 2023/0030586 | A1* | 2/2023 | Han | C23C 16/30 |

OTHER PUBLICATIONS

Gall et al., "Materials for interconnects", Oct. 2021, MRS Bulletin, vol. 46(10), 3 PGS, <https://doi.org/10.1557/s43577-021-00192-3>.

Han et al., "Topological Metal MoP Nanowire for Interconnect", Dept. of Mechanical Engineering and Materials Science, Yale Univ., New Haven, Conn. 06511, USA, Aug. 2022, Accessed Aug. 9, 2022, 18 PGS.

Lapedus., "Breaking the 2NM Barrier", Semiconductor Engineering, Feb. 18, 2021, 23 PGS, <https://semiengineering.com/breaking-the-2nm-barrier/>.

Singh et al., "Strong Correlation Between Mobility and Magnetoresistance in Weyl and Dirac Semimetals", IOP Publishing, J. Phys: mater.3 (2020) 024003, Feb. 25, 2020, 6 PGS, <https://doi.org/10.1088/2515-7639/ab6c34>.

* cited by examiner

INTEGRATED CIRCUIT DEVICE WITH INTERCONNECTS MADE OF LAYERED TOPOLOGICAL MATERIALS

BACKGROUND

The present disclosure relates in general to the field of integrated circuit devices and methods of fabrication of such devices. In particular, it is directed to an integrated circuit device having interconnects made of layered topological materials.

Interconnect technology closely follows developments in integrated circuit (IC) technology, which is now moving toward 2 nm processes. Copper is still the material of choice in interconnects of complementary metal-oxide-semiconductor (CMOS) structures. However, this material poses increasing difficulties as miniaturization progresses. In particular, copper resistivity is limited by grain boundaries and surface scattering. For example, the resistivity of a 10 nm-diameter copper wire is an order of magnitude higher than the bulk resistivity of copper. In fact, deeply scaling down the dimensions of copper interconnects causes their resistivity to exponentially increase.

SUMMARY

According to one aspect of the present disclosure, an integrated circuit device comprises one or more interconnects. Each interconnect is structured as a stack of layers, which includes distinct topological layers, where each of the distinct topological layers are a layer of topological material. Any two successive layers of the distinct topological layers are separated by one or more interfaces. Each of these interfaces forms a boundary between two consecutive layers of the stack, where the two consecutive layers are engineered to preserve topologically protected surface states of each of the any two successive layers of the distinct topological layers.

A multi-layer interconnect structure as described above results in multi-level topological currents that reduce the overall interconnect resistance. That is, the interconnect structure can be regarded as a set of surface-dominated topological conductors that give rise to unusual resistance scaling behaviors. To that aim, several topological layers are stacked, taking care of maintaining surface states of the topological layers. The idea is to split the interconnect into n topological layers, to favorably leverage surface conduction. That is, stacking n such topological layers approximately divides the bulk resistance by n, while multiplying the surface resistance by n. However, since the surface resistance of a topological material can be much smaller than its bulk resistance, the layer structure results in substantially improving scaling properties of the interconnects in terms of electrical performance. Compared to usual conductors, a stack of surface-dominated conductor layers can typically reduce the resistance by more than 70%.

In some embodiments, the stack of layers further includes interlayers. Each interlayer of the interlayers extends between two successive layers of the distinct topological layers, thus forming two interfaces with respective ones of the two successive layers, respectively. In this case, any two successive topological layers are separated by two interfaces, yet in a way that preserves the topologically protected surface states of each of the distinct topological layers.

Relying on interlayers makes it possible to use a same topological material in each of the successive topological layers of the stack, which makes it possible to rely on the same process of material synthesis to obtain each of the successive topological layers. In some embodiments, each of the distinct topological layers can have a same chemical composition and a same structural phase. The average thickness of each interlayer will typically be between 1 nm and 10 nm. In some cases, though, it is between 1 nm and 4 nm. For instance, each interlayer of the interlayers may be made of an ultrathin, electrically insulating material.

In some embodiments, any two successive layers of the distinct topological layers are consecutive layers having distinct chemical compositions, whereby the layer stack forms a heterostructure. In some embodiments, the stack of layers forms alternating layers of two topological materials having distinct chemical compositions.

Such an approach is advantageous, inasmuch as there is no need for adding interlayers, which results in better scalability. This also eases the fabrication process, to the extent that there is no need to deposit interlayers. However, this requires a controlled deposition of two or more topological materials of different compositions.

In some embodiments, any two successive layers of the distinct topological layers are consecutive layers, which have a same chemical composition, but distinct crystal structure properties, the latter ensuring opposite chiral orientations of the consecutive layers. In some embodiments, the distinct crystal structure properties consist of distinct crystal orientations, e.g., the consecutive layers have distinct crystal orientations.

Such an approach is advantageous too because it does not require adding interlayers. However, this approach still requires control of chirality, e.g., based on crystalline symmetries in each layer.

A variety of topological materials can, in principle, be used to obtain the stack of topological layers. Such materials can, for instance, include two-dimensional (2D) or three-dimensional (3D) topological materials. Examples of potentially suitable topological materials that can be used in the stack include NbAs, NbP, TaAs, TaP, $MoTe_2$, $WP_2$, $MoP_2$, $Ag_2S$, CoSi, $WTe_2$, and $TaIrTe_4$. Plus, as illustrated above, two consecutive layers can have different crystal structure properties or different chemical compositions, such that the stack possibly includes two or more of the above materials. In some embodiments, the topological material of one or more of the distinct topological layers is an electrically conducting topological material, such that both the bulk and surface areas are electrically conducting. For example, the topological material of one or more of the distinct topological layers can be a Dirac topological semimetal or a Weyl topological semimetal.

The average in-plane dimension of the layers of the stack is typically larger than 10 μm, while the average thickness of the distinct topological layers can be between 2 and 15 nm.

According to another aspect of the present disclosure, a method of manufacturing an integrated circuit device, including one or more interconnects, comprises depositing and structuring each interconnect of the one or more interconnects as a stack of layers to obtain the integrated circuit. The stack of layers includes distinct topological layers, where each of the distinct topological layers is a layer of topological material. Moreover, any two successive layers of the distinct topological layers are separated by one or more interfaces, each forming a boundary between two consecutive layers of the stack, where the two consecutive layers are engineered to preserve topologically protected surface states of each of the any two successive layers of the distinct topological layers. The stack of layers can be deposited and structured according to a subtractive deposition process or a damascene deposition process.

Manufacturing the integrated circuit device as described above is advantageous because the resulting multi-layer interconnect structure results in multi-level topological currents that reduce the overall interconnect resistance.

BRIEF DESCRIPTION OF THE DRAWINGS

These and other objects, features and advantages of the present disclosure will become apparent from the following detailed description of illustrative embodiments thereof, which is to be read in connection with the accompanying drawings. The illustrations are for clarity in facilitating one skilled in the art in understanding the present disclosure in conjunction with the detailed description. The drawings are only illustrative of certain embodiments and do not limit the disclosure.

Figure 1:
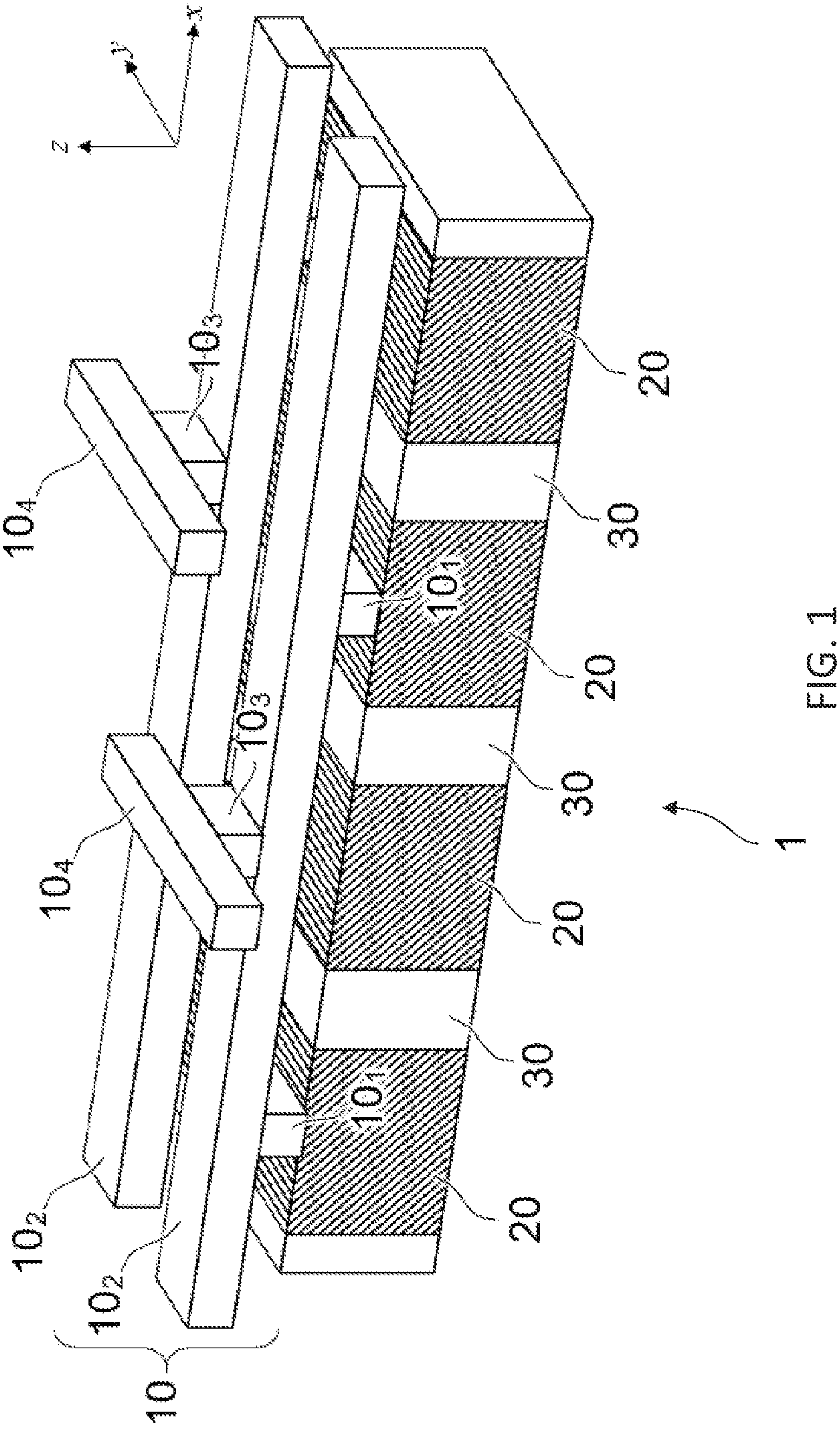
FIG. 1 is a 3D view of a portion of a simplified example of integrated circuit device, the interconnects of which can be structured as a stack of layers including distinct layers of topological materials, in accordance with some embodiments of the present disclosure.

The accompanying drawings show simplified representations of devices or parts thereof, as involved in various embodiments. Technical features depicted in the drawings are not necessarily to scale. Similar or functionally similar elements in the figures have been allocated the same numeral references, unless otherwise indicated.

Integrated devices and fabrication methods embodying the present disclosure will now be described, by way of non-limiting examples.

DETAILED DESCRIPTION

Aspects of the present disclosure are directed toward integrated circuit devices having interconnects made of layered topological materials, where the layer stacks preserve the topologically protected surface states of the layers of topological materials. While not limited to such applications, embodiments of the present disclosure may be better understood in light of the aforementioned context.

One aspect of the present disclosure is now described in reference to FIG. 1, FIG. 2, FIG. 3, and FIG. 4. This aspect is directed to an integrated circuit (IC) device 1, such as schematically depicted in FIG. 1. The IC device 1 is typically structured to form several levels of interconnects 10, which typically connect circuit elements 20 to each other and/or to ohmic contacts. The circuit elements 20 can be embedded in a dielectric material 30 (as assumed in FIG. 1) or rest on a dielectric layer. The various interconnect elements $\mathbf{10}_1$, $\mathbf{10}_2$, $\mathbf{10}_3$, $\mathbf{10}_4$ are also normally embedded in a dielectric material (not shown for clarity).

Figure 2:
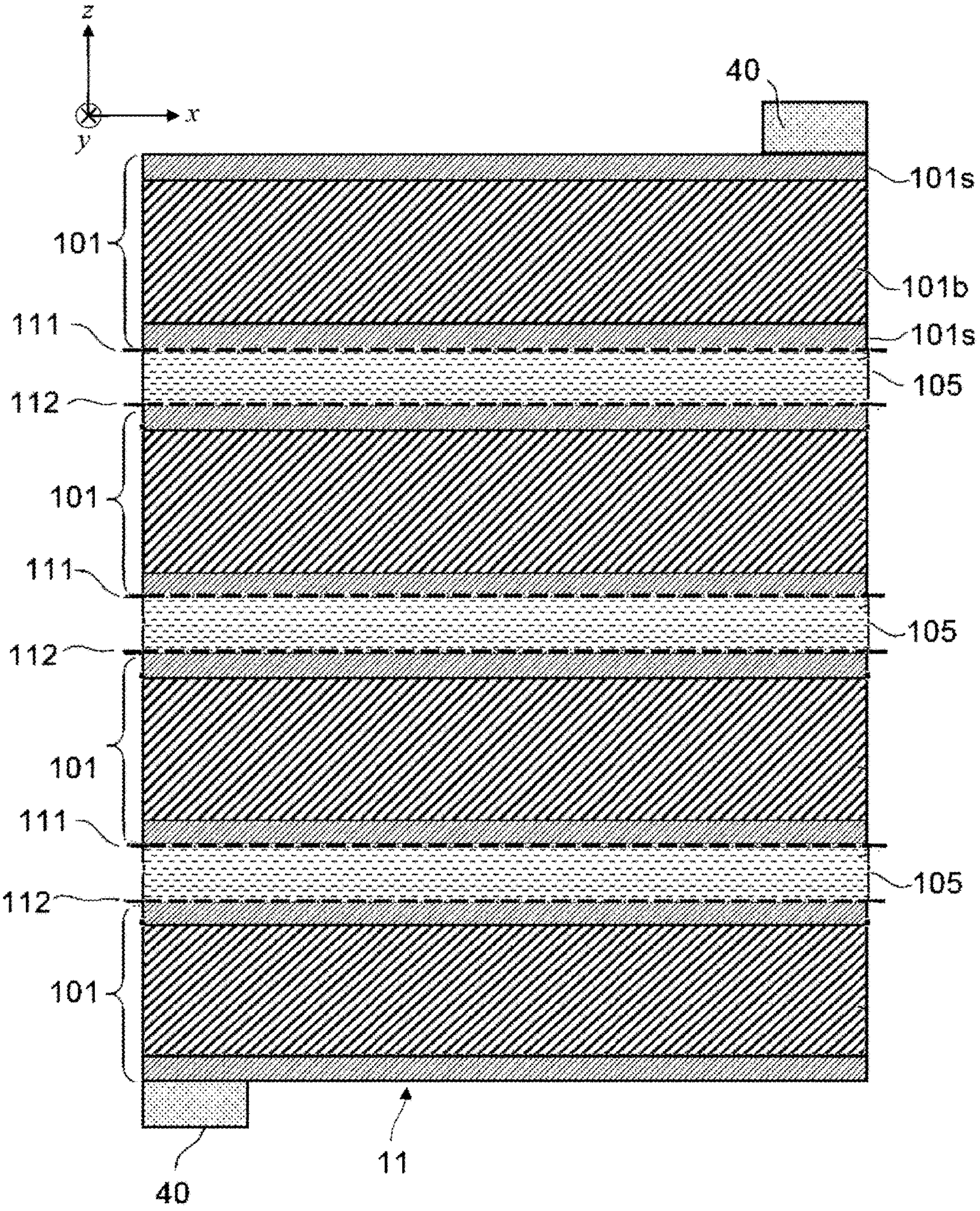
FIG. 2 is a 2D cross-sectional view of a stack of distinct topological material layers separated by interlayers, in accordance with some embodiments of the present disclosure.
Figure 3:
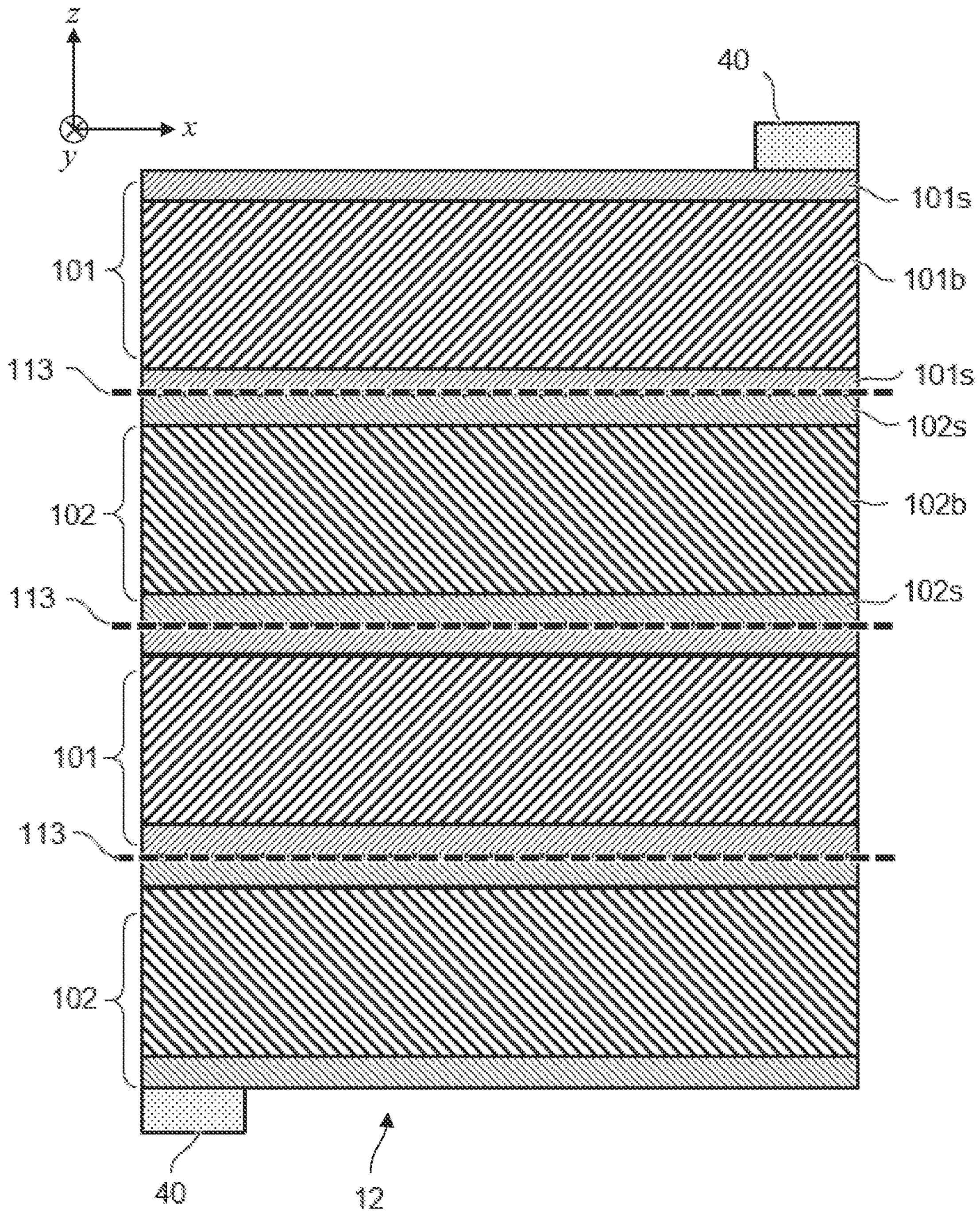
FIG. 3 is a 2D cross-sectional view of a stack of distinct topological material layers forming a topological heterostructure, in accordance with some embodiments of the present disclosure.
Figure 4:
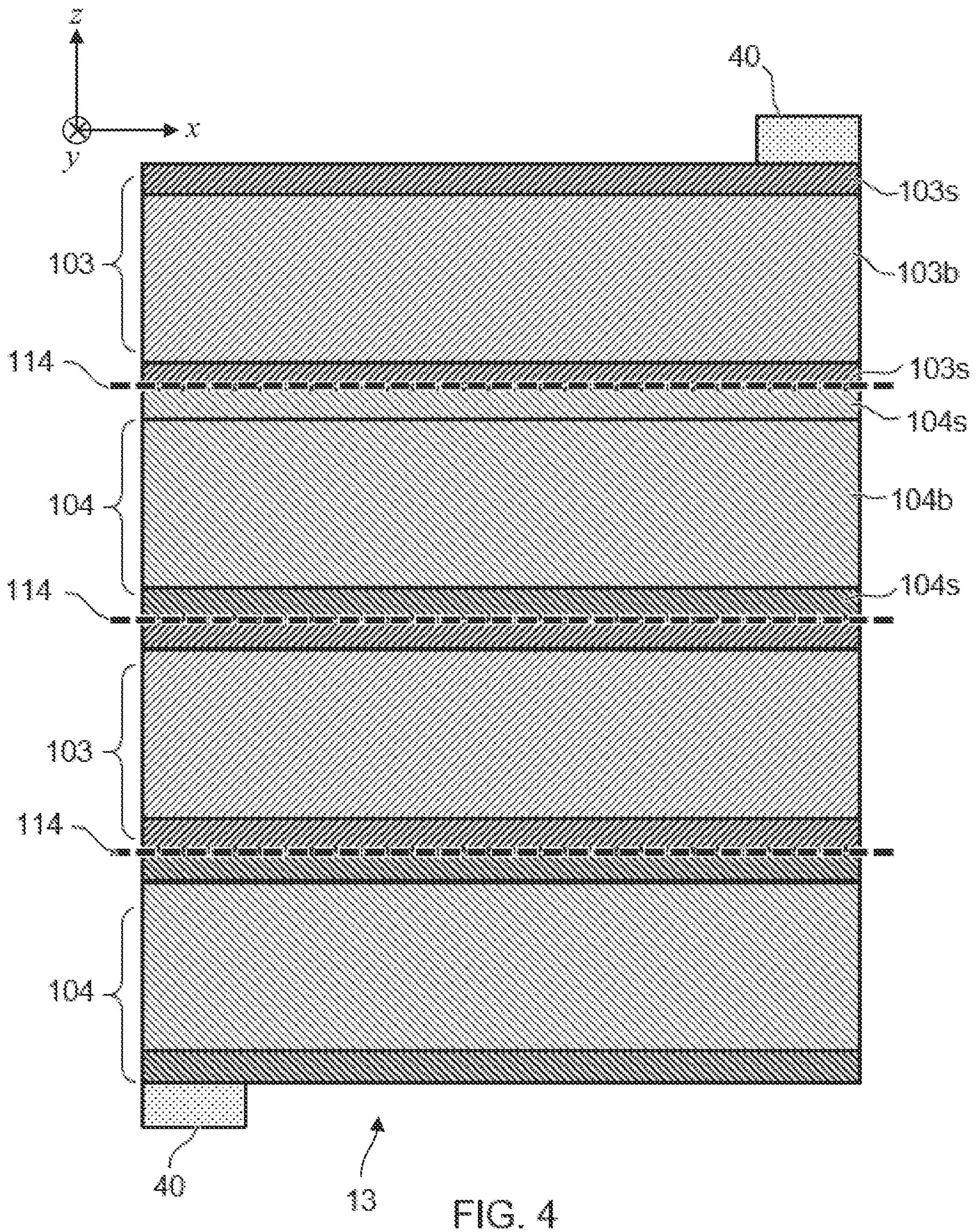
FIG. 4 is a 2D cross-sectional view of a stack of distinct topological material layers having a same chemical composition but distinct crystal structure properties, in accordance with some embodiments of the present disclosure.

In prior IC devices, such interconnects are usually made of metal, such as copper. On the contrary, in the context of the present disclosure, each interconnect element $\mathbf{10}_1$, $\mathbf{10}_2$, $\mathbf{10}_3$, $\mathbf{10}_4$ is structured as a stack 11, 12, and 13 of layers, such as shown in FIG. 2, FIG. 3, and FIG. 4. The layer stack includes distinct topological layers 101, 102, 103, and 104. As referred to herein, a "topological layer" refers to a layer of topological material.

Topological materials are materials that can support a flow of electrons on their surface (e.g., in a superficial region close to the surface), thanks to topologically protected surface states. Note, in the accompanying drawings, each topological layer 101, 102, 103, 104 is schematically divided in a bulk part 101*b*, 102*b*, 103*b*, 104*b*, sandwiched between superficial regions 101*s*, 102*s*, 103*s*, 104*s*. Surface states of topological materials are said to be topologically protected as a result of topological properties of such materials. Such properties are known per se, and are highly dependent on the dimensions of such materials and their symmetries. Topological protection means the system cannot spontaneously and continuously break its topological properties, which offers protection to the charge carriers against scattering events. This protection ensures low electrical resistivity through the material.

The topological layers 101, 102, 103, 104 may be made of topological insulators and/or topological semimetals, such as topological Weyl semimetals, topological Dirac semimetals, and topological nodal-line semimetals. Such topological materials are typically obtained as crystalline materials, e.g., monocrystalline or polycrystalline materials. In principle, however, some of these materials can also be amorphous. The topologically protected surface states of such topological materials result in that such materials are able to conduct charge carriers, irrespective of whether their bulk is electrically conducting or not. This also applies to topological insulators, which do conduct charge carriers, although only at their surface.

In the present context, the topological layers 101, 102, 103, 104 are distinct layers, meaning they are well separated, e.g., by a well-defined interface 111, 112, 113, 114, something that can be verified thanks to suitable microscopy techniques such as transmission electron microscopy (TEM). An interface is the boundary between two spatial regions occupied by different solid-state matter, or by solid-state matter having distinct structural properties, e.g., forming distinct phases of the same solid-state matter or having different crystal orientations.

Two successive topological layers of the stack can possibly be separated by a single interface 113, 114, as in FIG. 3 and FIG. 4. In variants, interlayers 105 are interspersed between two successive topological layers, as in FIG. 2. The interlayer 105 gives rise to two well-defined interfaces 111, 112 separating the two successive topological layers. Thus, the successive topological layers can be arranged consecutively, as in FIGS. 3 and 4, or be separated by an interlayer 105 (e.g., a separating layer). Any two successive topological layers 101, 102, 103, 104 are separated by one or more interfaces 111, 112, 113, 114.

The topological layers are successively arranged along a stacking direction, which is assumed to be the direction z in the accompanying drawings. Note, in the examples of FIG. 2, FIG. 3, and FIG. 4, the stacking direction happens to coincide with the intended direction of current propagation, hence the presence of electrodes 40 on top and at the bottom of the stacks 11, 12, 13. However, this does not necessarily need to be the case. In fact, the interconnects may have various possible shapes, as necessary to connect the circuit element, see FIG. 1.

Each separating interface 111, 112, 113, 114 forms a boundary between two consecutive layers of the stack 11, 12, 13. These two consecutive layers can be topological layers (as in FIG. 3 and FIG. 4) or consist of a topological layer 101 and a separating layer 105, as in FIG. 2. The two consecutive layers on each side of a separating interface are engineered (e.g., deposited and processed) to preserve the topologically protected surface states of each of the successive topological layers separated by this interface. So, the separating interfaces can themselves be regarded as being engineered to preserve the topologically protected surface states of each of the successive topological layers.

Examples of suitable engineering involve separating interlayers 105, which, e.g., match to the topological layers so as to form pristine atomic interfaces, as well as consecutive topological layers that are processed to give rise to opposite chiral currents in the consecutive layers. The successive topological layers are separated by well-defined interfaces, engineered so as to preserve topologically protected surface states of the individual topological layers 101, 102, 103, 104, which eventually form topologically protected surface states for the layer stack 11, 12, 13 itself. As such, individual layer states contribute to, and therefore reflect in, the states of the whole layer stack.

The proposed layer structure arrangement of the interconnect aims at improving scaling properties, in terms of electrical performance of the interconnects. To that aim, several topological layers are stacked, taking care of maintaining surface states of the topological layers. The idea is to split a conductor into n topological layers, to favorably leverage surface conduction. Detailed explanations follow.

Figure 5A:
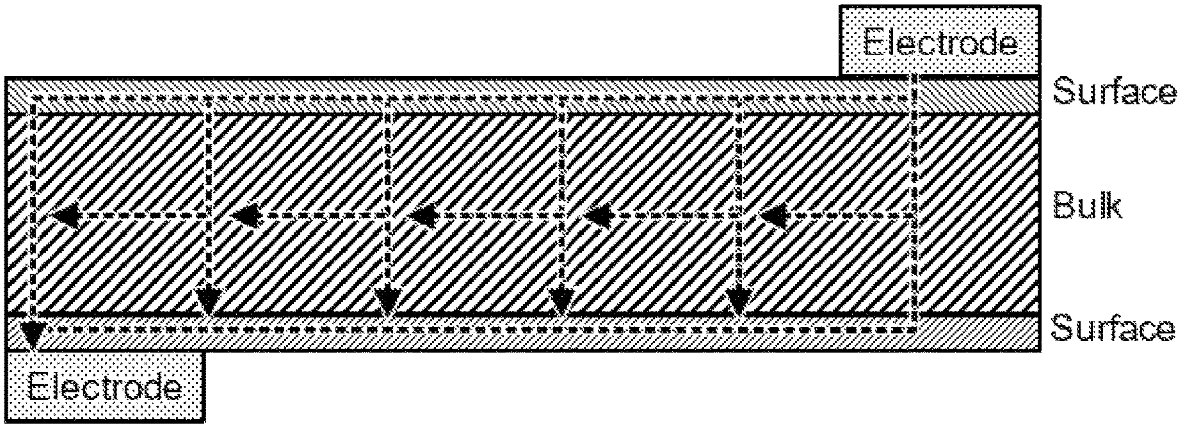
FIGS. 5A and 5B illustrate an electrical conduction mechanism involved in stacks of topological material layers, in accordance with embodiments of the present disclosure.
Figure 5B:
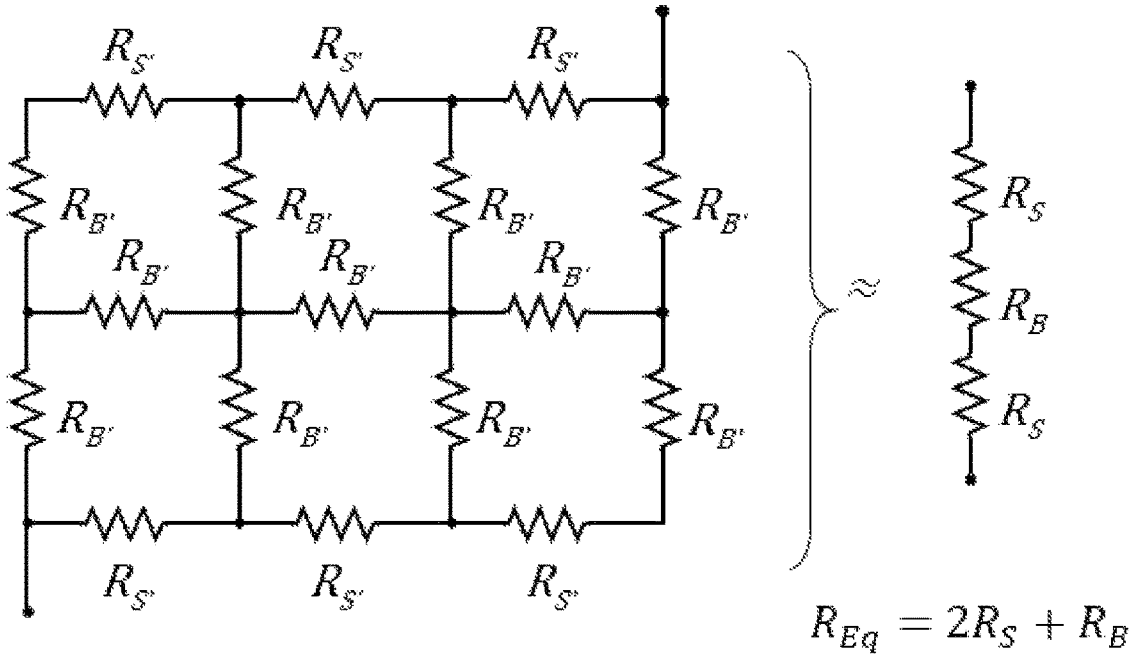

FIG. 5A illustrates the current propagation through a topological layer, from a top electrode to a bottom electrode. FIG. 5B shows an equivalent resistance circuit. The resistance $R_S$ and $R_B$ denote unit resistance values for the surface and bulk states, respectively. In a usual electrical conductor, these two quantities are normally equal ($R_S=R_B$). However, conductors having topologically protected surface states can have the property $R_S \ll R_B$, as in the case of topological semimetals and topological insulators. So, as illustrated in FIG. 5B, the equivalent resistance of a surface-dominated topological conductor can be approximated as $R_{Eq} \approx 2R_S+R_B$. Now, stacking n such topological layers amount to defining a layered transformation, which can be noted $L_n(R_{Eq}) \approx 2nR_S+R_B/n$. So, for example, for a topological material having a surface resistance that is 50 times smaller than its bulk resistance, a 5-layer transformation reduces its resistance by approximately 70%. Even a 2-layer transformation can reduce the resistance by approximately 50%. Thus, using a stack of surface-dominated conductor layers can reduce the resistance by more than 70%.

Figure 6A:
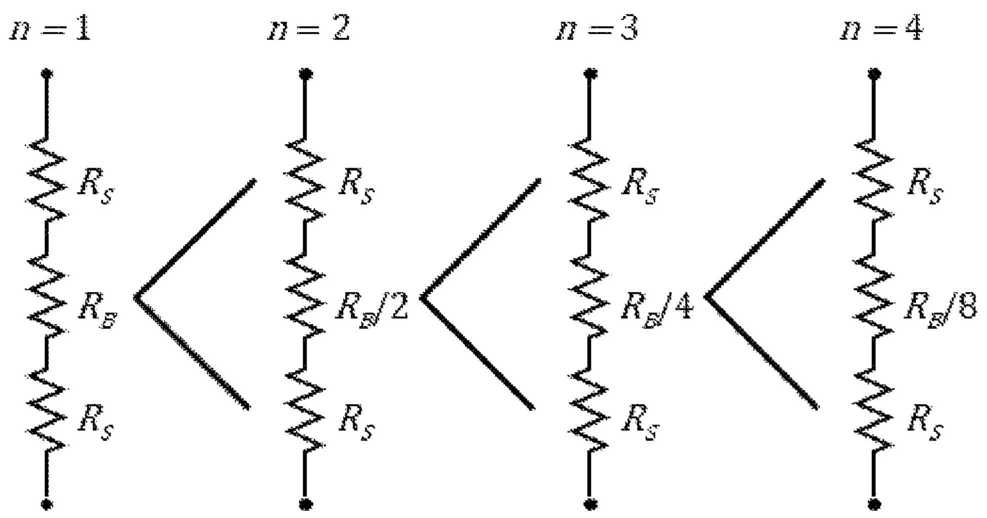
FIGS. 6A and 6B illustrate another electrical conduction mechanism involved in stacks of topological material layers, in accordance with embodiments of the present disclosure.
Figure 6B:
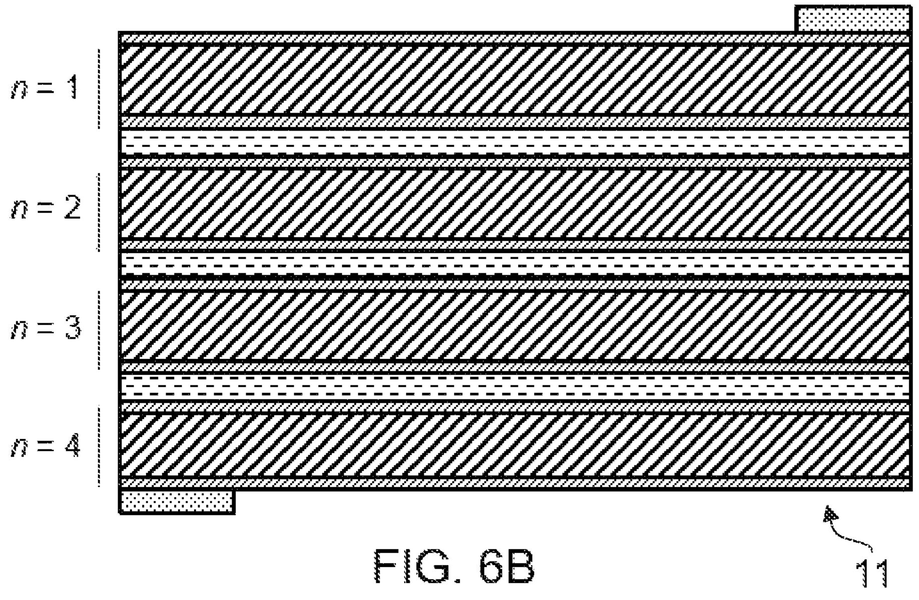

FIG. 6A and FIG. 6B illustrate the effect of splitting a surface-dominated topological conductor (SDTC) into four layers. In order to achieve properties as described above, one must adequately split the surface-dominated topological conductor, something that can be achieved by suitably stacking topological material layers. Still, care should be taken to maintain clean interfaces, so as to preserve the surface states of the topological layers. Several possibilities can be contemplated to obtain a suitable layer stack.

As discussed above, one technique is to separate the successive topological layers 101 by at least one interlayer 105, such as a single interlayer, as assumed in FIG. 2. In that case, two successive topological layers 101 in the stack are not consecutive layers. Any two successive topological layers 101 in the stack are actually separated by two interfaces. For example, a first interface 111 is formed between a given topological layer 101 and the adjacent interlayer 105 (immediately below this layer 101 in FIG. 2), while a second interface 112 is formed between this interlayer 105 and the next topological layer 101 (immediately below this interlayer 105 in FIG. 2). Each of the two separating interfaces must accordingly be engineered so as to preserve (maintain) the surface states of the successive topological layers. That is, the materials, shapes, and local arrangements of the consecutive materials 101, 105, 101 involved on each side of the separating interfaces must not substantially alter the surface states of the topological layers 101.

Another technique is to rely on sufficiently distinct topological layers, which can thus be consecutively arranged in the stack, such that there is no intermediate layer, as in FIG. 3 and FIG. 4. The consecutive topological layers can differ in terms of chemical composition and/or structural properties. That is, in some embodiments, the two regions on each side of the interface 113 between two consecutive topological layers 101, 102 can be occupied by different solid-state matter, so that the consecutive topological layers have different chemical compositions, resulting in a heterostructure, as in FIG. 3. Note, the chemical compositions should substantially differ, whereby two consecutive topological layers 101, 102 involve different chemical elements, different proportions of such elements, or substantially different dopant amounts. In variants, the solid-state matter in the two layers 103, 104 on each side of a separating interface 114 has different structural properties, e.g., distinct phases or crystal orientations, resulting in opposite chiral orientations, as assumed in FIG. 4.

In the above examples, any two successive layers of the distinct topological layers are separated by one or more well-defined interfaces. These can be regarded as heterointerfaces, inasmuch as they separate distinct solid-state matter, engineered so as to preserve the topologically protected surface states of the successive topological layers. Not only does this ensure electricity conduction across the interconnect but, in addition, this has benefits in terms of electrical resistance, when scaling down the interconnect. A multilayer interconnect structure as described above results in multi-level topological currents that reduce the overall interconnect resistance. The interconnect structure can be regarded as a set of surface-dominated topological conductors, which give rise to unusual resistance scaling behaviors, enhancing the electrical performance of the interconnects 10.

An aspect of the present approach is to achieve interfaces that preserve the topologically protected states of the successive topological layers. The separating interfaces should not substantially alter the protected surface states of the topological layers. That is, the separating interfaces should be compatible with such surface states. In particular, any two layers on each side of a separating interface bounding a topological layer should be engineered (e.g., deposited and processed) so as to preserve the topologically protected surface states of the successive topological layers bounded by the separating interface.

In reference to particular embodiments of the present disclosure, the topological layers can include topological semimetals and/or topological insulators. As said, topological insulators do conduct charge carriers, but only at the surface. That being said, a multilayer stack of topological insulators will be more conductive than a single layer of topological insulator, because the former involves more conducting surfaces. That is, while the reduction in resistance in a stack of topological insulators may already be quite remarkable, a multilayer stack of topological semimetals will, in principle, be more efficient than a multilayer stack of topological insulators in conducting a current flow. As a result, some embodiments rely on topological semimetals, such as Dirac topological semimetals and Weyl topological semimetals.

The topological layers 101, 102, 103, 104 can notably be made of Dirac semimetals (DSMs) or Weyl semimetals (WSM). In particular, the topological layers can be made of 3D topological materials, such as type-1 WSMs (e.g., NbAs, NbP, TaAs) and type-2 WSMs (e.g., $WP_2$, $MoP_2$, $WTe_2$, $MoTe_2$, $TaIrTe_4$). In principle, however, the topological layers 101, 102, 103, 104 can be made of other types of topological materials, such as magnetic Weyl semimetals (e.g., PrAlGe, $Co_2MnGa$, $Co_3Sn_2S_2$, $Mn_3Sn$, $Mn_3Ge$), materials containing multifold fermions (e.g., CoSi, RhSi), and nodal line semimetals (e.g., $Ag_2S$, $Co_2MnGa$, ZrSiS, HfSiS, $PbTaSe_2$). As previously discussed, topological insulators can be contemplated too, such as materials from the $Bi_2X_3$ family where X=O, S, Se, or Te. A further possibility is to use 2D van der Waals topological materials, such as graphene, transition metal dichalcogenides $MX_2$ (where M=W or Mo, and X=Te, S, Se, or $MnBi_2Te_4$). Plus, 2D and 3D materials may possibly be combined to form heterostructures. So, a variety of topological materials, and combinations thereof, can be contemplated.

The average in-plane dimension of the layers of the stack 11, 12, 13 is typically larger than 10 μm. The in-plane dimension is measured in the plane (x, y), perpendicularly to the stacking direction z. The average thickness of the distinct topological layers 101, 102, 103, 104 can be between 2 and 15 nm. This thickness is measured along the axis z. Of course, the optimal thickness depends on the desired properties of the interconnects, the materials used, and the desired form factor of the IC devices 1. In general, the thickness of each topological layer can be chosen so as to avoid crosstalk between top and bottom Fermi surface states, because crosstalk can cause electron back-scattering and thus increase the resistance.

As noted earlier, some embodiments involve separator interlayers 105, see FIG. 2. Each interlayer extends between two successive topological layers 101. It acts as a spacer that separates two successive topological layers in the stack. In some embodiments, a single interlayer 105 is provided between two successive topological layers 101. Each interlayer forms two interfaces 111, 112 with the adjacent layers 101. The layers of the stack are deposited and structured so as not to jeopardize the topological surface states of the topological layers. To that aim, the interlayers 105 should not have energy states at/close to the Fermi level of the topological conductors or ultimately the whole layer stack. In principle, suitably engineered interlayers 105 can potentially give rise to additional surface states, which will contribute to enhance the surface currents.

Various types of materials can be contemplated for the interlayers 105, as long as such materials do not substantially impact the topologically protected surface states of the adjacent topological layers. For example, the materials used in layers 105 should not have energy states at or close to the Fermi level of the topological conductors. Still, diverse types of material can, in principle, be used to fabricate the interlayers 105, including dielectrics (e.g., $SiO_2$, $Al_2O_3$), topological materials (e.g., topological insulators such as $Bi_2Se_3$ or $Bi_2Te_3$), and even metals (e.g., Al, Cu, Ta). Indeed, if an interlayer is made of metal that is thin enough, then the topological surface states of the adjacent topological layers may survive thanks to topological protection. 2D van der Waals (vdW) materials, such as hexagonal boron nitride or $CrCl_3$, are another option. The weak vdW bonds induce less strain at interfaces, which help preserve the topological surface states of the adjacent layers 101.

In other embodiments, interlayers 105 are made of an electrically insulating material. Each interlayer 105 may for instance be made as an ultrathin insulator, which resists the transverse current flow, in the sense of classical physics. Notwithstanding, this insulator can be made thin enough to allow a transverse current to tunnel from one topological layer to the next, and thus allow current to flow transversely to the stack 11. When using ultrathin insulators as interlayers 105, the resistance of the whole stack 11 will not substantially increase, while carriers can flow by tunneling through such insulating layers. For instance, the separators can be made of ultrathin oxides or nitrides, having thicknesses of 1 to a few nanometers.

For interconnects that are sufficiently long in an in-plane direction, i.e., in the plane (x, y), the transverse resistance (along z) of the interlayers becomes relatively small because most electrical current transport occurs in-plane. In general, the average thickness of the interlayers 105 will be less than 50 nm; In some embodiments, it can be between 1 nm and 10 nm. However, in embodiments where the separator is an electrical insulator, then it can be made sufficiently thin to allow transverse tunnelling. In such cases, the interlayer thickness will typically be between 1 and 4 nm.

Relying on separator interlayers 105 makes it possible to use a same topological material 101 in each of the successive topological layers of the stack 11, as assumed in FIG. 2. Moreover, this topological material may have a same structural phase in each layer 101. This makes it possible to rely on a same process of material synthesis to obtain each of the successive topological layers. Note, even if the topological layers 101 are isomorphous, they can locally differ, in terms of, e.g., grain sizes and/or grain orientations. However, a disadvantage of such additional interlayers 105 is that they increase the overall height of the interconnect structure. They can also increase the resistivity (though mainly along the stacking direction).

Thus, in some embodiments the layer stack 12 is designed as a topological heterostructure, as assumed in FIG. 3. Here the topological layers 101, 102 are consecutively arranged but are made of dissimilar materials (e.g., materials of different chemical compositions). Indeed, any topological material layer with protected surface states also acts as a separator material. Thus, a suitable separation can also be achieved thanks to different topological materials. The layer stack 12 accordingly forms a topological heterostructure, in which surface states are nonetheless preserved. Such an approach is advantageous, inasmuch as there is no need for adding interlayers 105, which results in better scalability.

This cases the fabrication process, to the extent that there is no need to deposit interlayers. However, this requires a controlled deposition of two or more topological materials of different compositions.

Some embodiments of the present disclosure rely on two different topological materials. That is, the layer stack 12 forms alternating layers 101, 102 of two topological materials of distinct chemical compositions, whereby topological layers of two distinct compositions alternate along the stacking direction z.

For example, the layer stack may be made of two Weyl semimetals. Each Weyl semimetal layer is characterized by charge carriers with a certain chirality $\chi=\pm1$, i.e., a spin-momentum locking configuration. Chirality is a conserved quantity in nature. In a Weyl semimetal, the conservation of chirality prevents the carrier spins from flipping. At least, this property makes it harder for electrons to flip spins. The conservation of chirality in Weyl semimetals contributes to the robustness of the protected surface states (e.g., it is a form of topological protection of the charge carriers, including carriers associated with surface states).

That being said, the conservation of chirality does not prevent local disparities. In particular, it is possible to engineer topological layer surfaces showing opposite average chiral orientations. One possibility to achieve this is to grow consecutive topological layers that have a same chemical composition but distinct crystal structure properties, as in some embodiments now described in reference to FIG. 4. In this example, the layer stack 13 includes topological Weyl semimetal layers 103, 104 that are arranged as consecutive layers. The layers 103, 104 have a same chemical composition but distinct crystal structure properties. Such properties are engineered to provide chirality control. Namely, the crystal structure properties of consecutive layers are such as to ensure opposite chiral orientations from one layer 103 to the other 104, so that charge carriers have opposite chiral orientations, on average.

Chirality control can notably be achieved by engineering distinct crystal orientations in any two consecutive topological Weyl semimetal materials of same composition. Thus, two consecutive layers 103, 104 may have different crystal orientations, resulting in opposite chiral orientations. One may for instance exploit unique properties topological Weyl semimetals where chirality of currents is locked. This can be used to implement surface state separation between subsequent layers 103, 104 without requiring a separator as in FIG. 2 or FIG. 3. Still, FIG. 3 can be regarded as a special case of FIG. 2, where consecutive topological layers have different crystal orientations, instead of having distinct compositions.

While this approach allows topological materials of a same chemical composition to be used, it still requires control of chirality based on crystalline symmetries in each layer, something that is fairly difficult to achieve in practice. Thus, it can be beneficial to rely on layer structures as in FIGS. 2 and 3. All in all, the layer stack of FIG. 2 is the simplest to fabricate, while the stack of FIG. 3 offers better performance due to the lack of interlayers.

Next, according to another aspect of the present disclosure, a method of manufacturing an IC device 1 including one or more interconnects 10 is described. The method aims at obtaining the IC device 1 by depositing and structuring each interconnect 10 of the IC device 1 as a stack 11, 12, 13 of layers as described earlier in reference to FIG. 2, FIG. 3, FIG. 4. Eventually, the stack 11, 12, 13 includes distinct topological layers 101, 102, 103, 104, where any two successive topological layers 101, 102, 103, 104 are separated by one or more interfaces 111, 113, 114, each forming a boundary between two consecutive layers of the stack 11, 12, 13, where the consecutive layers are engineered to preserve topologically protected surface states of each of the two successive topological layers.

Figure 7A:
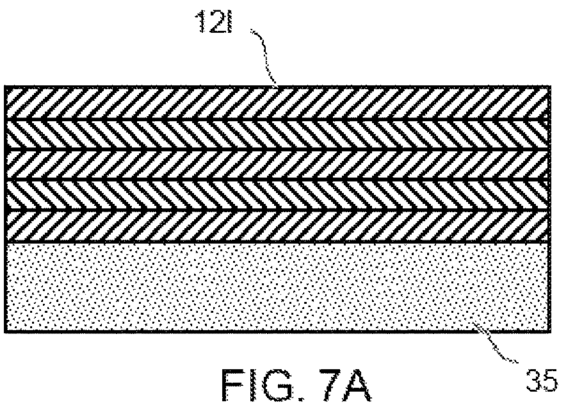
FIGS. 7A, 7B, 7C, and 7D are sequences of 2D cross-sectional views illustrating high-level fabrication steps of integrated circuits using a subtractive deposition process, in accordance with some embodiments of the present disclosure.
Figure 7B:
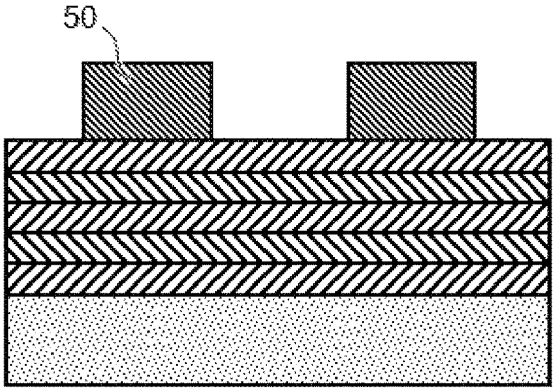
Figure 7C:
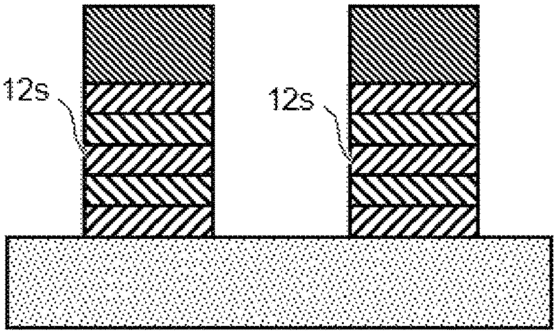
Figure 7D:
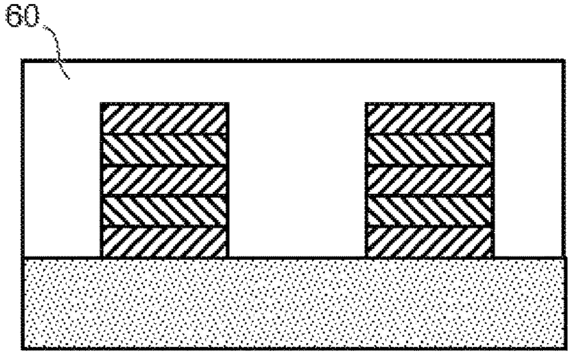

The layer stack 11, 12, 13 may for instance be deposited and structured according to a subtractive deposition process, as illustrated in FIG. 7A, FIG. 7B, FIG. 7C. 7D. For example, topological layers 121 may first be deposited, one after the other, on a supporting layer 35 such as a dielectric layer, as shown in FIG. 7A. The layers of the stack 121 are deposited using a suitable film deposition technique. They may for instance be deposited using epitaxial methods such as physical vapor deposition (PVD) techniques like molecular-beam epitaxy (MBE) or precise thin-film deposition techniques, such as atomic layer deposition (ALD). In this example, the deposited layer stack 121 forms a heterostructure, as in FIG. 3. Next, a mask layer 50 is deposited and structured on top of the stack 121 (FIG. 7B), prior to subtractively etching through the structured mask layer and the layer stack 121 to form structured stacks 12*s*, separated by gaps (FIG. 7C). The gaps are finally filled by a dielectric material 60, such as $SiO_2$, see FIG. 7D. Such steps may typically be completed by planarization steps and deposition of further dielectric layers.

Figure 8A:
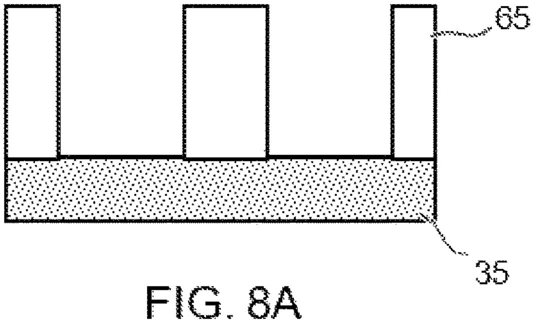
FIGS. 8A, 8B, 8C, 8D, and 8E are sequences of 2D cross-sectional views illustrating high-level fabrication steps of integrated circuits using a damascene-like deposition process, in accordance with some embodiments of the present disclosure.
Figure 8B:
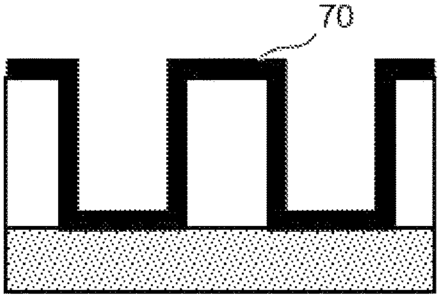
Figure 8C:
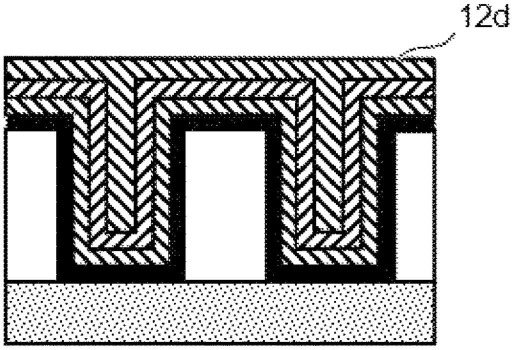
Figure 8D:
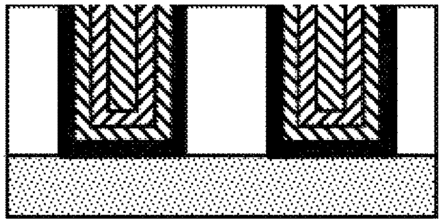
Figure 8E:
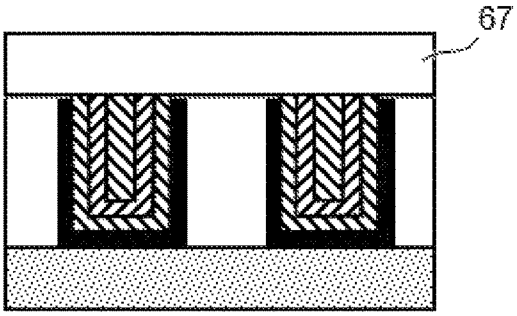

In variants, the layer stack 11, 12, 13 is deposited and structured according to a damascene-like deposition process. For example, a dielectric damascene etch step may be performed through an oxide layer 65, itself resting on a supporting layer 35, see FIG. 8A. Next, a seed layer 70 is deposited on top of the structured dielectric (FIG. 8B), prior to depositing the layer stack 12*d* of topological materials on the seed layer 70 (FIG. 8C), using a suitable thin-film deposition technique as discussed above. The upper part of the deposited layers is subsequently removed (FIG. 8D) and a dielectric layer 67 is deposited on top (FIG. 8E). Such steps may again be completed by planarization steps and deposition of additional dielectric layers.

While the present disclosure has been described with reference to a limited number of embodiments, variants, and the accompanying drawings, it will be understood by those skilled in the art that various changes may be made, and equivalents may be substituted without departing from the scope of the present disclosure. In particular, a feature (device-like or method-like) recited in a given embodiment, variant or shown in a drawing may be combined with or replace another feature in another embodiment, variant or drawing, without departing from the scope of the present disclosure. Various combinations of the features described in respect of any of the above embodiments or variants may accordingly be contemplated, that remain within the scope of the appended claims. In addition, many minor modifications may be made to adapt a particular situation or material to the teachings of the present disclosure without departing from its scope. Therefore, it is intended that the present disclosure is not limited to the particular embodiments disclosed, but that the present disclosure will include all embodiments falling within the scope of the appended claims. In addition, many other variants than explicitly touched above can be contemplated. For example, other materials than those explicitly mentioned may be contemplated, whether for the topological layers, substrate, dielectric fillers, etc.

What is claimed is:

1. An integrated circuit device comprising:

one or more interconnects, wherein each interconnect of the one or more interconnects is structured as a stack of layers including distinct topological layers, each of the distinct topological layers being a layer of topological material, and any two successive layers of the distinct topological layers are separated by one or more interfaces, each forming a boundary between two consecutive layers of the stack, where the two consecutive layers are engineered to preserve topologically protected surface states of each of the any two successive layers of the distinct topological layers, and the two consecutive layers have characteristics selected from a group consisting of: different chemical compositions, and different crystal structure properties.

2. The integrated circuit device according to claim 1, wherein the topological material of one or more of the distinct topological layers is an electrically conducting topological material.

3. The integrated circuit device according to claim 1, wherein an average in-plane dimension of the layers of the stack is larger than 10 μm.

4. The integrated circuit device according to claim 1, wherein an average thickness of the distinct topological layers is between 2 nm and 15 nm.

5. The integrated circuit device according to claim 1, wherein the topological material of one or more of the distinct topological layers is a 3D topological material.

6. The integrated circuit device according to claim 1, wherein the topological material of one or more of the distinct topological layers is a Dirac topological semimetal.

7. The integrated circuit device according to claim 1, wherein the topological material of one or more of the distinct topological layers is a Weyl topological semimetal.

8. The integrated circuit device according to claim 7, wherein the topological material of one or more of the distinct topological layers is one selected from a group consisting of: NbAs, NbP, TaAs, TaP, CoSi, $MoTe_2$, $WP_2$, $MoP_2$, $Ag_2S$, $WTe_2$, and $TaIrTe_4$.

9. The integrated circuit device according to claim 1, wherein the stack of layers further includes interlayers, each interlayer of the interlayers extends between two successive layers of the distinct topological layers, thus forming two interfaces with respective ones of the two successive layers, respectively.

10. The integrated circuit device according to claim 9, wherein each interlayer of the interlayers is made of an electrically insulating material.

11. The integrated circuit device according to claim 10, wherein an average thickness of each interlayer is between 1 nm and 10 nm.

12. The integrated circuit device according to claim 1, wherein when the selected characteristics of the two consecutive layers are different chemical compositions, the any two successive layers of the distinct topological layers are consecutive layers having distinct chemical compositions, whereby the layer stack forms a heterostructure.

13. The integrated circuit device according to claim 12, wherein the stack of layers form alternating layers of two topological materials of distinct chemical compositions.

14. The integrated circuit device according to claim 1, wherein when the selected characteristics of the two consecutive layers are different crystal structure properties, the any two successive layers of the distinct topological layers are consecutive layers having a same chemical composition and distinct crystal structure properties, the distinct crystal structure properties ensuring opposite chiral orientations of the consecutive layers.

15. The integrated circuit device according to claim 14, wherein the distinct crystal structure properties consist of distinct crystal orientations, whereby the consecutive layers have distinct crystal orientations.

16. A method of manufacturing an integrated circuit device including one or more interconnects, comprising:

depositing and structuring each interconnect of the one or more interconnects as a stack of layers to obtain the integrated circuit, wherein the stack of layers including distinct topological layers, each of the distinct topological layers being a layer of topological material, and any two successive layers of the distinct topological layers are separated by one or more interfaces, each forming a boundary between two consecutive layers of the stack, where the two consecutive layers are engineered to preserve topologically protected surface states of each of the any two successive layers of the distinct topological layers, and the two consecutive layers have characteristics selected from the group consisting of: different chemical compositions, and different crystal structure properties.

17. The method according to claim 16, wherein the stack of layers is deposited and structured according to a subtractive deposition process.

18. The method according to claim 16, wherein the stack of layers is deposited using a damascene deposition process.

* * * * *